(12) United States Patent
Tower

(10) Patent No.: US 11,547,012 B2
(45) Date of Patent: Jan. 3, 2023

(54) RAIL KIT STRENGTHENING BRACKET

(71) Applicant: HEWLETT PACKARD ENTERPRISE DEVELOPMENT LP, Houston, TX (US)

(72) Inventor: Daniel W. Tower, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 500 days.

(21) Appl. No.: 16/393,747

(22) Filed: Apr. 24, 2019

(65) Prior Publication Data

US 2020/0344907 A1 Oct. 29, 2020

(51) Int. Cl.
*H05K 7/14* (2006.01)
*A47B 96/07* (2006.01)
*H05K 7/18* (2006.01)

(52) U.S. Cl.
CPC ........... *H05K 7/1489* (2013.01); *A47B 96/07* (2013.01); *H05K 7/183* (2013.01)

(58) Field of Classification Search
CPC ...... H05K 7/1489; H05K 7/183; A47B 96/07; A47B 88/477; A47B 88/43; A47B 88/46; A47B 88/473; A47B 2210/0091; A47B 2088/76; A47B 88/40; A47B 88/49
See application file for complete search history.

(56) References Cited

U.S. PATENT DOCUMENTS

| | | | | |
|---|---|---|---|---|
| 1,231,291 A | * | 6/1917 | Otte | ........................... 312/334.8 |
| 5,634,701 A | * | 6/1997 | Hendrich | .............. E05B 65/464 |
| | | | | 312/221 |
| 8,028,965 B2 | * | 10/2011 | Chen | ..................... A47B 88/493 |
| | | | | 248/298.1 |
| 8,147,011 B2 | * | 4/2012 | Chen | ....................... F16C 29/04 |
| | | | | 312/334.44 |
| 8,585,166 B2 | * | 11/2013 | Chen | ..................... A47B 88/493 |
| | | | | 312/334.46 |
| 9,867,308 B2 | | 1/2018 | Chen et al. | |
| 10,194,555 B2 | | 1/2019 | Chen | |
| 2006/0152115 A1 | * | 7/2006 | Dubon | .................... A47B 88/43 |
| | | | | 312/334.8 |
| 2014/0265788 A1 | * | 9/2014 | Judge | ................... H05K 7/1489 |
| | | | | 312/334.1 |
| 2014/0363109 A1 | * | 12/2014 | Chen | ...................... A47B 88/43 |
| | | | | 384/22 |
| 2017/0303426 A1 | | 10/2017 | Chen | |
| 2017/0363144 A1 | * | 12/2017 | Chen | ...................... A47B 88/40 |
| 2018/0125234 A1 | | 5/2018 | Chen et al. | |

FOREIGN PATENT DOCUMENTS

CN 108323088 A 7/2018

OTHER PUBLICATIONS

Riverbed Technology, Inc., "Riverbed—Rack Installation Guide," Dec. 2016, https://support.riverbed.com/bin/support/download?did-hpjiiirdku47imjrv3s64rtjt2&version=6.0.0.

* cited by examiner

*Primary Examiner* — Ko H Chan
(74) *Attorney, Agent, or Firm* — Hewlett Packard Enterprise

(57) ABSTRACT

A rail kit, comprising: an outer slide; a first strengthening bracket attached to a back of the outer slide; a rear bracket to fit over the outer slide; and a second strengthening bracket attached to a back side of the rear bracket.

19 Claims, 6 Drawing Sheets

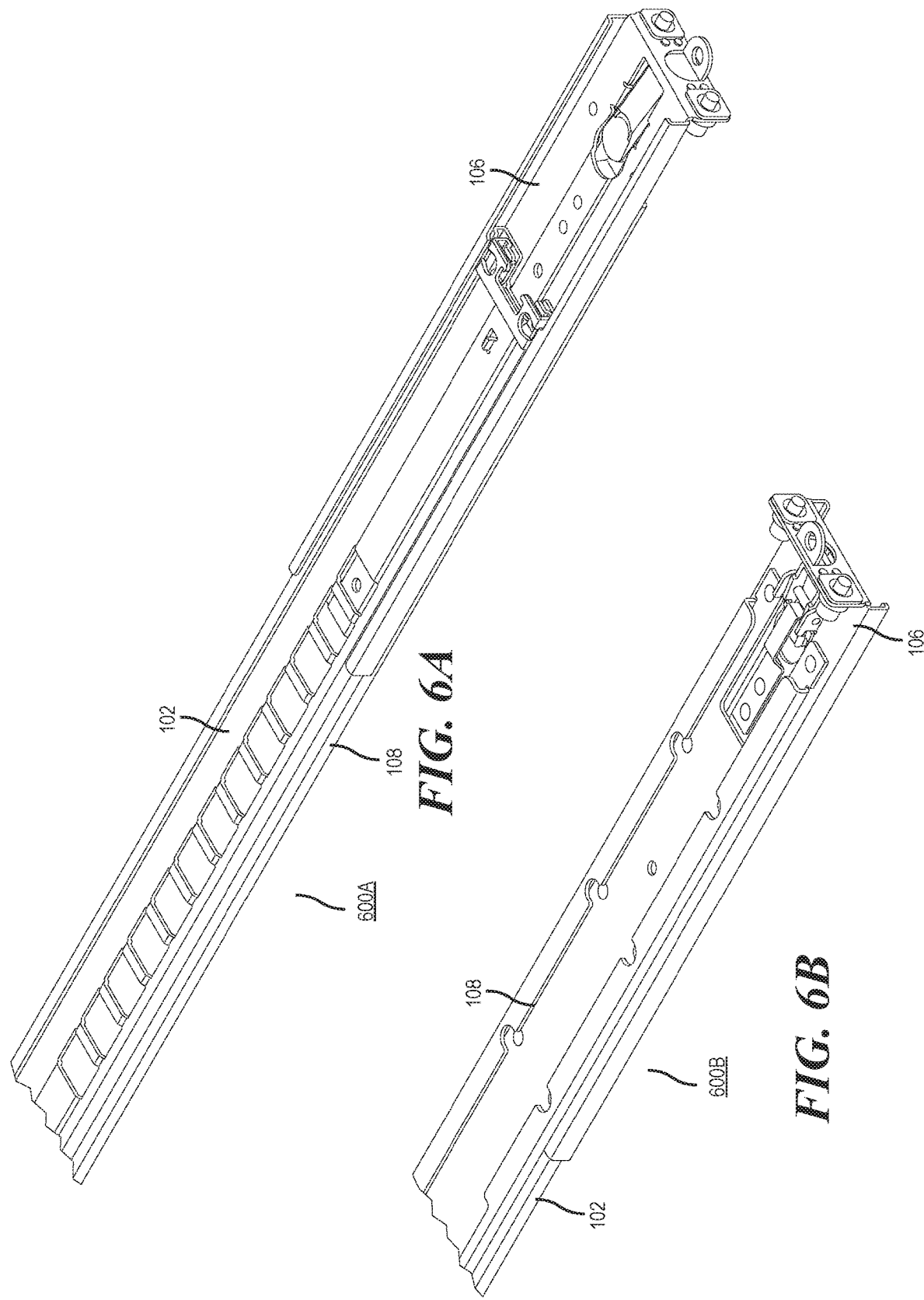

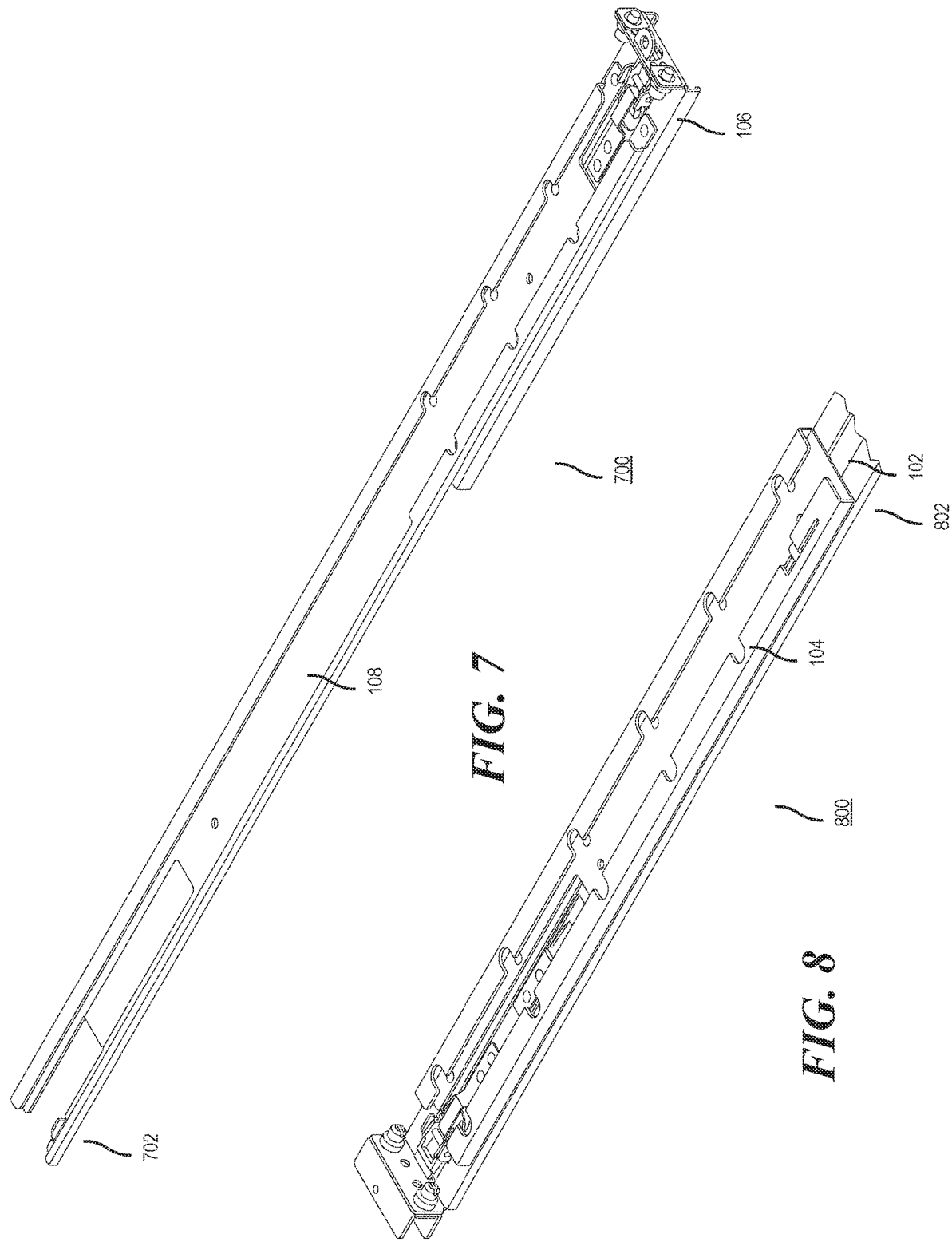

RAIL KIT STRENGTHENING BRACKET

BACKGROUND

Computing devices, particularly servers, may be added to or installed in a rack. A rack may be a structure for housing multiple computing devices. Generally, a rack may consist of four posts or columns with mounting holes or apertures to facilitate the addition or mounting of computing devices. A rail kit may attach to a computing device and to a rack, thus allowing a computing device to be mounted to the rack. Further the rail kit may allow the computing device to be slid in and out of the rack while remaining mounted to the rack, thus providing access to a user for a portion of the computing device. The rail kit may be formed to support a certain weight, based on past models of computing devices.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

FIGS. 6A and 6B are schematic views of a rail kit including a second strengthening bracket, according to an example;

FIG. 7 is a schematic view of a rear bracket and second strengthening bracket, according to an example; and FIG. 8 is a schematic view of an outer slide and strengthening bracket, according to an example.

DETAILED DESCRIPTION

Figure 1:
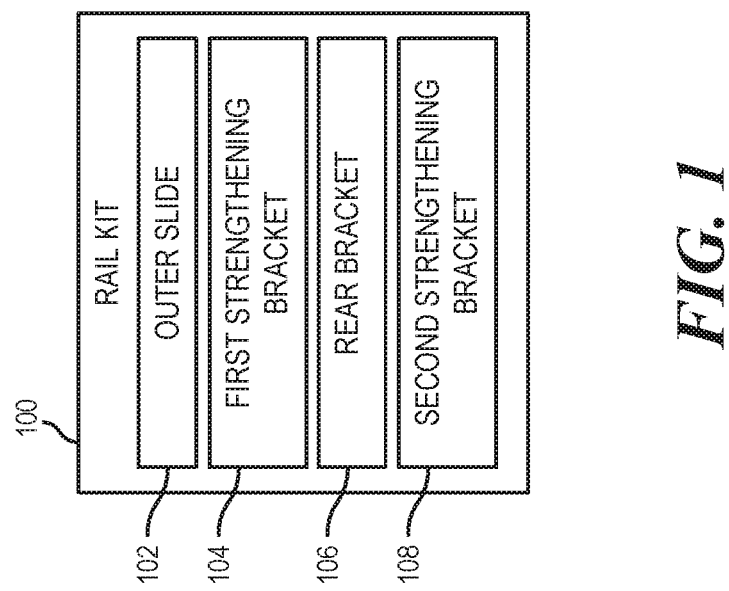
FIG. 1 is a block diagram of a rail kit, according to an example.

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Computing devices, particularly servers, may be added to or installed in a rack. A rack may be a structure for housing multiple computing devices. Generally, a rack may consist of four posts or columns with mounting holes or apertures to facilitate the addition or mounting of computing devices. A rail kit may attach to a computing device and to a rack, thus allowing a computing device to be mounted to the rack. Further the rail kit may allow the computing device to be slid in and out of the rack while remaining mounted to the rack, thus providing access to a user for a portion of the computing device. The rail kit may be formed to support a certain weight, based on past models of computing devices.

As noted, a rail kit may be formed to support a certain weight, based on past models of computing devices. In addition, rail kits are usually thin and less than 1 U (depending on the size of the computing device). Newer computing devices may be heavier than normal or older models. Due to the weight, a normal rail kit may not be able to support the computing device. The inability to offer proper support may introduce a hazard to users installing or servicing computing devices. For example, a computing device may be added to a rack (via the rail kits). If the rail kits are not able to support the computing device, the rail kit may bend or deform in a downwards direction. In such examples, the computing device may fall if the rail kits suffer such a critical failure. Computing devices, including newer models, are heavy. If a computing device falls from, say, the top of a rack, the computing device could be destroyed, cause other equipment damage, or cause injury to users.

Thus, the present disclosure describes examples of new rail kits that may include strengthening brackets which may allow for proper support of heavier computing devices. Examples may ensure safety for users and ensure that equipment and computing devices do not suffer damage due to mechanical failures.

Examples described herein, include a rail kit. The rail kit includes an outer slide and a rear bracket. A first strengthening bracket may be attached to the outer slide. Further, the first strengthening bracket may be attached to the backside of the outer slide (as in, the side facing away from a computing device when the rail kit is attached to a computing device). The first strengthening bracket may form or include a channel to accept another strengthening bracket (such as, a second strengthening bracket). In another example, the first strengthening bracket may form or include guides to be accepted by a channel on another strengthening bracket (e.g., second strengthening bracket). The first strengthening may be fixed to the outer slide or be modularly attachable to the outer slide. The rail kit, as noted, may include a rear bracket. The rear bracket may include a channel to fit over the outer slide (in other words, the outer slide may accept, engage with, or attach to a rear bracket). The rear bracket may allow the rail kit to expand or contract to different lengths to allow for insertion into different sized racks (for example, a column depth of 19 inches or 23 inches). The rear bracket may include a second strengthening bracket. Further, the second strengthening bracket may be attached to the backside of the rear bracket (as in, the side facing away from a computing device when the rail kit is attached to a computing device). The second strengthening bracket may form or include a channel to accept another strengthening bracket (such as, the first strengthening bracket). In another example, the second strengthening bracket may form or include guides to be accepted by a channel on another strengthening bracket (e.g., first strengthening bracket). When the rear bracket connects with the outer slide and the first strengthening bracket connects with the second strengthening bracket, the rail kit may offer sufficient support for heavier computing device models.

FIG. 1 is a block diagram of a rail kit 100, according to an example. The rail kit 100 may include an outer slide 102. The rail kit 100 may also include a first strengthening bracket 104. The first strengthening bracket 104 may be attached to or coupled to the outer slide 102 (for example, the first strengthening bracket 104 may be attached to the backside or back of the outer slide 102). The rail kit 100 may also include a rear bracket 106. The rear bracket 106 may fit over or couple to the outer slide 102. The rail kit 100 may include a second strengthening bracket 108. The second strengthening bracket 108 may be attached or coupled to the backside or back of the rear bracket 106. The second strengthening bracket 108 may be insertable into, attachable to, or may couple to the first strengthening bracket 104.

As used herein, a "computing device" may be a storage array, storage device, storage enclosure, server, blade server, desktop or laptop computer, computer cluster, node, partition, virtual machine, or any other device or equipment including a controller, a processing resource, or the like. In examples described herein, a "processing resource" may include, for example, one processor or multiple processors included in a single computing device or distributed across multiple computing devices. As used herein, a "processor" may be at least one of a central processing unit (CPU), a semiconductor-based microprocessor, a graphics processing unit (GPU), a field-programmable gate array (FPGA) to retrieve and execute instructions, other electronic circuitry suitable for the retrieval and execution instructions stored on a machine-readable storage medium, or a combination thereof.

As used herein, "rack unit" or "U" may refer to the unit of measurement to define the height of a rack frame and the height of the equipment in a rack frame (such as, computing devices). Each rack unit may be equivalent to 44.50 millimeters or 1.75 inches. For example, a computing device, such as a rack server, may have a height of 2 U or 2 rack units (in other words, 89 millimeters or 3.5 inches).

As used herein, "horizontal" and/or "horizontally" refer to directions that are parallel to a longitudinal dimension of the bracket assembly, whereas "vertical" and/or "vertically" refer to directions that are perpendicular to the horizontal. In FIGS. 1-8, "horizontal" directions are parallel to the y-axis, while "vertical" directions are parallel to the z-axis. Thus, both $+\hat{y}$ and $-\hat{y}$ directions may be "horizontal", and both $+\hat{z}$ and $-\hat{z}$ directions may be "vertical". When one of the example rail kits is installed in a rack, the "horizontal" directions may be parallel to a line extending between corresponding mounting holes in opposing columns of the device rack, and the "vertical" directions may be parallel to a direction in which the columns extend. Horizontal movement or extension is movement or extension in any horizontal direction, whereas vertical movement or extension is movement or extension in any vertical direction.

As used herein, "forward" refers to an orientation that is aligned with a horizontal vector pointing from a rear of the bracket assembly toward a front of the bracket assembly, while "rearward" refers to an orientation that is aligned with a horizontal vector pointing from a front of the bracket assembly toward a rear of the bracket assembly. In FIGS. 1-8, "forward" is aligned with the $+\hat{y}$ direction, while "rearward" is aligned with the $-\hat{y}$ direction. When one of the example rail kits is installed in a device rack, the "forward" orientation may be aligned with a vector extending from a rear column of the device rack to a front column of the device rack, and vice-versa for the "rearward" orientation. Forward movement or extension is movement or extension in a forward oriented direction, whereas rearward movement or extension is movement or extension in a rearward oriented direction.

As used herein, "inward" refers to an orientation that is aligned with a vector that would point from the rail kit toward the electronic device if the electronic device were mounted to the rail kit. As used herein and in the appended claims, "outward" refers to an orientation that is the opposite of the "inward" orientation (i.e., an orientation that is aligned with a vector that would point away from the electronic device if the electronic device were mounted to the rail kit). "Inward" and "outward" for one rail kit will not necessarily be identical to "inward" and "outward" for another rail kit, since the different rail kits may be oriented differently from one another. For example, when a pair of rail kits is installed in a device rack, they may be facing each other, and thus "inward" for one of the rail kits may be pointing in an opposite direction as "inward" for the other one of the rail kits. For example, in FIGS. 1-8, "inward" is aligned with the $+\hat{x}$ direction for the left-side rail kit 10L, and with the $-\hat{x}$ direction for the right-side rail kit 10R. Similarly, "outward" is aligned with the $-\hat{x}$ direction for the left-side rail kit 10L and the $+\hat{x}$ direction for the right-side rail kit 10R. Inward movement or extension is movement or extension in an inward oriented direction, whereas outward movement or extension is movement or extension in an outward oriented direction.

As used herein, a first element may be to "couple" with a second element if the first element is capable of extending into an opening defined by the second element.

As used herein, a first element may be considered to "prevent movement" of a second element in some specified direction if the first element constrains the second element such that it cannot move in the specified direction beyond some point; however, this does not imply that the first element necessarily has to keep the second element from any and all movement in the specified direction. In other words, when it is said that some element "locks" another element, this does not mean that it completely prevents all movement of the element, but rather that it sets some constraint on movement. For example, when it is said that the first latch prevents the inner slide and middle slide from moving in both the forward direction and the rearward direction when it is in the locked position, this means that the first latch constrains the movement of the inner slide in the forward and rearward directions to be within some finite range of positions; however, the first latch does not necessarily prevent the inner slide and outer slide from all forward and rearward motion and the inner slide and middle slide may move forward and rearward freely within the finite range. This reflects the fact that some finite tolerance or "wiggle room" may be inevitable due to manufacturing variances. In addition, in certain examples some finite tolerance or "wiggle room" may be intentionally included in the design to facilitate smooth functioning of the locking mechanism.

As used herein and in the appended claims, a first element is "connectable" to a second element if the first element is so configured that it is capable of being connected to the second element; however, this does not require that the first element actually be connected to the second element. For example, in the example rail kit the inner slide may not be connected to any electronic device initially, but the inner slide is nonetheless still "connectable" to an electronic device even in this state because the inner slide is so configured that it could be connected to an electronic device.

As used herein and in the appended claims, a first element is "engagable" by a second element if the first element is so configured that it is capable of being engaged by the second element; however, this does not require that the first element actually be engaged by the second element. For example, in the example rail kit the inner slide may not be engaged by the middle slide initially, but the inner slide is nonetheless still "engagable" by the middle slide even in this state because the inner slide is so configured that it could be engaged by the middle slide.

FIG. 1 is a block diagram of a rail kit 100, according to an example. As noted above the rail kit 100 may include an outer slide 102. The outer slide 102 may retain a middle slide and the middle slide may retain an inner slide. The inner slide may attach to a side of a computing device. Another inner slide of another rail kit may attach to the other side of the computing device (the other side being parallel to the side). In a further example, a user may add, install, couple or attach a computing device to a rack via the rail kit 100. In other words, a user may attach an inner slide to two parallel sides of a computing device and drop in, couple, install, or attach the computing device with attached inner slides to the middle slide (the middle slide being retained by the outer slide).

In another example and as noted above, the rail kit 100 may also include a first strengthening bracket 104. The first strengthening bracket 104 may be attached or coupled to the outer slide 102. In a further example, the first strengthening bracket 104 may attach or couple to the backside or back of the outer slide 102. In other words, the first strengthening bracket 104 may attach to the side of the outer slide 102 that is opposite the side that attaches to a computing device. In another example, the first strengthening bracket 104 may be fixedly attached to the outer slide 102. For example, the first strengthening bracket 104 may be attached or coupled to the outer slide 102 via rivets, screws, stakes, or other similar means to fix the first strengthening bracket 104. In another example, the first strengthening bracket 104 may be attached via tool-less fasteners to the outer slide 102. In other words, the first strengthening bracket 104 may be modular and could be added to any outer slide 102 at any time. In another example, the first strengthening bracket 104 may include, comprise, or form a channel to accept another strengthening bracket (for example, the second strengthening bracket 108). In another example, the first strengthening bracket 104 may include, comprise, or form guides to insert into another strengthening bracket (for example, the second strengthening bracket 108).

In an example and as noted above, the rail kit 100 may include a rear bracket 106. The rear bracket 106 may fit over the outer slide 102. In other words, the rear bracket 106 may form a channel that allows engagement with the outer slide 102. The rear bracket 106 may move freely back and forth in relation to the outer slide 102. The rear bracket 106 may allow for the rail kit 100 to fit into various sized racks.

In an example and as noted above, the rail kit 100 may include a second strengthening bracket 108. In an example, the second strengthening bracket 108 may be attached to the rear bracket 106. In a further example, the second strengthening bracket 108 may attach to the backside or back of the rear bracket 106. In other words, the second strengthening bracket 108 may attach to the side of the rear bracket 106 that is opposite the side that attaches to a computing device. In another example, the second strengthening bracket 108 may be fixedly attached to the rear bracket 106. For example, the second strengthening bracket 108 may be attached to the rear bracket 106 via rivets, screws, stakes, or other similar means to fix the second strengthening bracket 108. In another example, the second strengthening bracket 108 may be attached via tool-less fasteners to the rear bracket 106. In other words, the second strengthening bracket 108 may be modular and could be added to any rear bracket 106 at any time. In another example, the second strengthening bracket 108 may include, comprise, or form a channel to accept another strengthening bracket (for example, the first strengthening bracket 104). In another example, the second strengthening bracket 108 may include, comprise, or form guides to insert into another strengthening bracket (for example, the first strengthening bracket 104).

Figure 2:
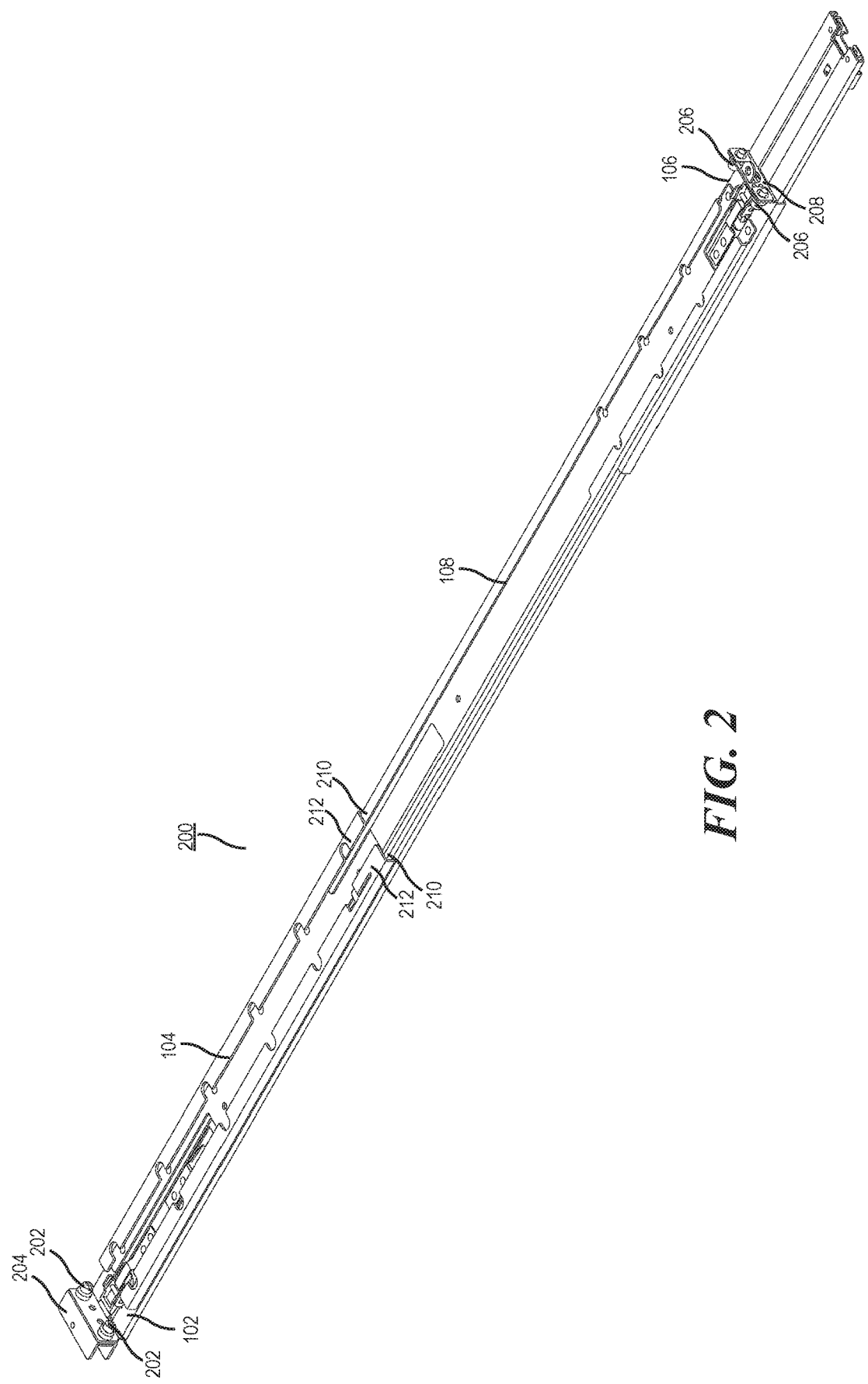
FIG. 2 is a schematic view of a rail kit including strengthening brackets, according to an example.

FIG. 2 is a schematic view of a rail kit 200 including strengthening brackets 104, 108, according to an example. In an example, rail kit 200 may include an outer slide 102 connected to a rear bracket 106 or rear assembly. In such examples, the outer slide 102 may include a perpendicular connector 204. The connector 204 may include guide pins 202. The guide pins 202 may connect to columns of a rack. In another example, the outer slide 102 may insert into rear bracket 106.

In FIG. 2, the rail kit 200 may include a rear bracket 106. The rear bracket 106 may slide onto or fit over the outer slide 102. In another example, the rear bracket 106 may include a second connector 208, positioned at the end of the rear bracket 106 in a perpendicular position. The second connector 208 may include guide pins 206. Guide pins 206 may connect to columns of a rack (thus connecting the rail kit 200 to the rack).

In FIG. 2, the rail kit 200 may be fully extended. In other words, the rail kit 200 may fit into a deeper rack. For example, the rail kit 200 of FIG. 2 may fit into an Electronic Industries Association (EIA) 23 inch column depth rack. As noted, the outer slide 102 may insert into the rear bracket 106 or rear assembly. The rear bracket 106 may adjust (for example, slide back or forth) to allow for the rail kit 200 to fit into different size racks.

In FIG. 2, rail kit 200 may include a first strengthening bracket 104 and a second strengthening bracket 108. In an example, the first strengthening bracket 104 may be attached to the outer slide 102. In another example, the first strengthening bracket 104 may include channels 212. In another example, the second strengthening bracket 108 may be attached to the rear bracket 106. The second strengthening bracket 108 may include guides 210 to fit into or insert into the channels 212 of the first strengthening bracket 104. In such examples, as the rear bracket 106 is slid onto the outer slide 102, the second strengthening bracket 108 may insert into the first strengthening bracket 104. In a further example, once the second strengthening bracket 108 is inserted past a certain point, a clip or prong on the first strengthening bracket 104 may lock both strengthening brackets 104, 108 together, while allowing the rear bracket 106 and second strengthening bracket 108 to move within a certain range (explained further below in relation to FIG. 4).

Figure 3:
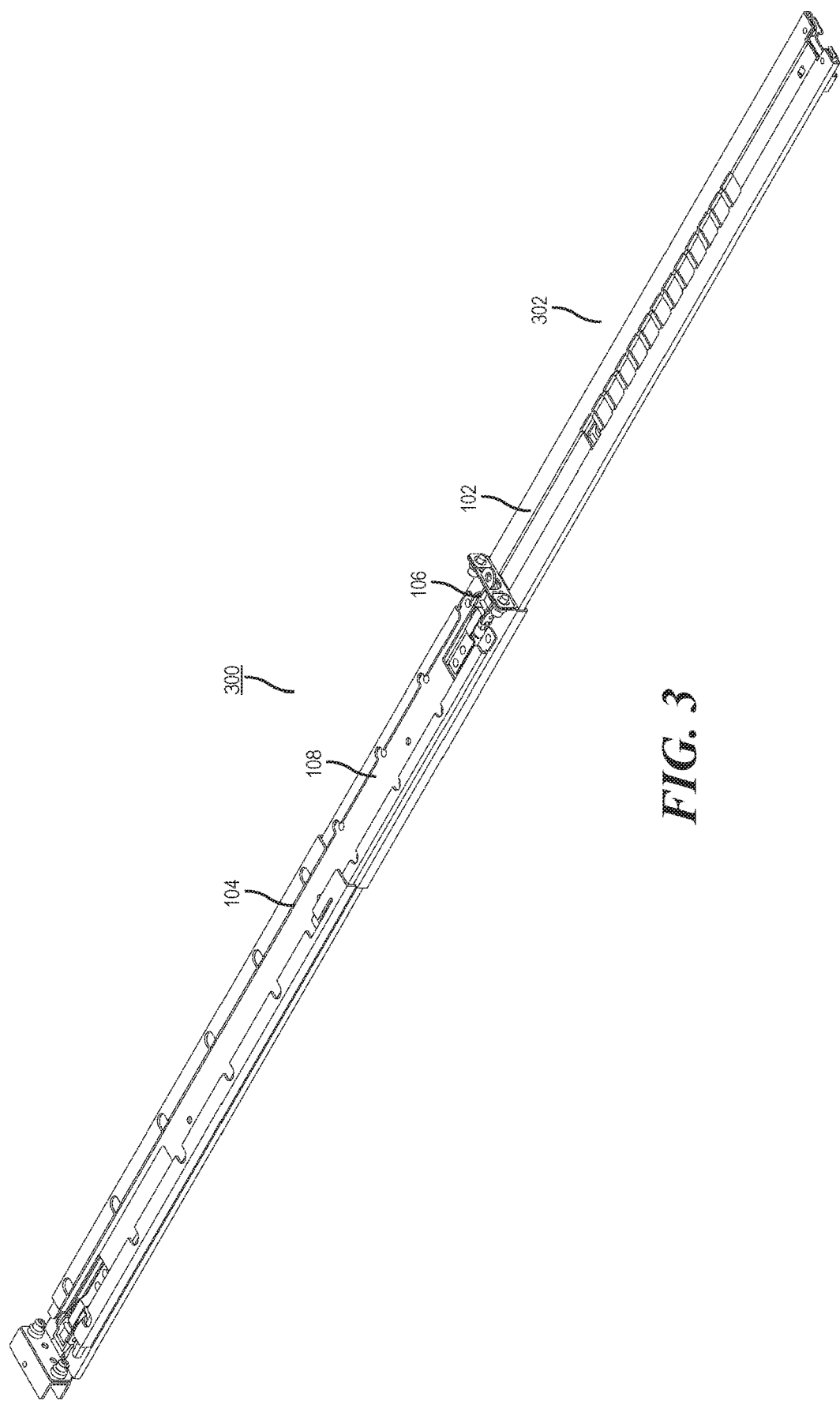
FIG. 3 is another schematic view of a rail kit including strengthening brackets, according to an example.

FIG. 3 is another schematic view of a rail kit 300 including strengthening brackets 104, 108, according to an example. In such examples, the rail kit 300 may be in the shortest configuration. In a further example, the rail kit 300 may be configured to fit into an EIA 19 inch column depth rack. In another example, the outer slide 102 may be a fixed length. In such examples, when the rail kit is configured for a shorter column depth (e.g., EIA 19 inch column depth rack), a larger portion of the outer slide 302 may extend out of the back of the rail kit 300 (thus, extend out of the back of a rack the rail kit 300 is installed in).

Figure 4:
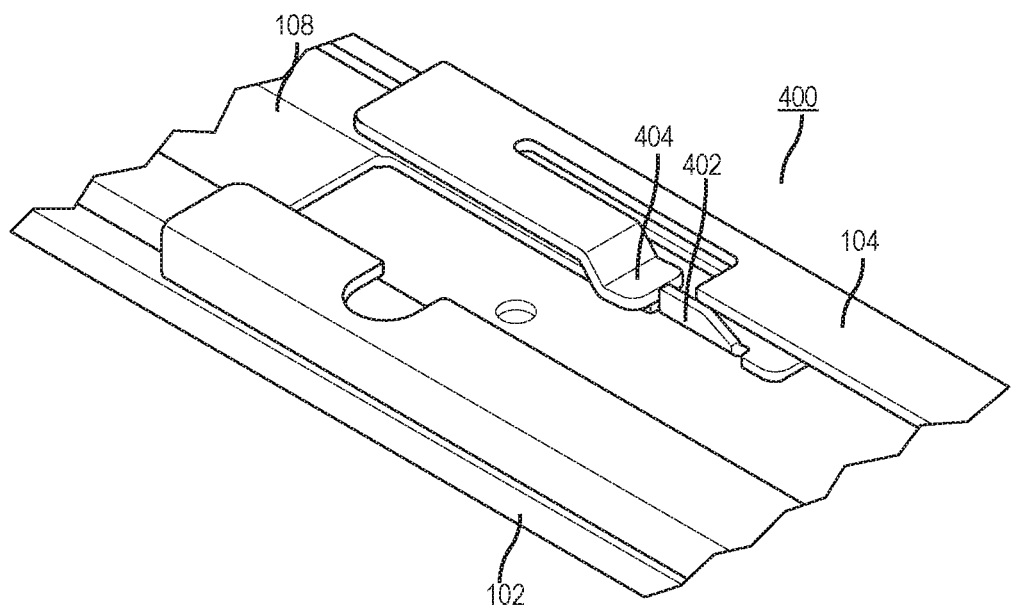
FIG. 4 is a schematic view of a close-up of a portion of a rail kit including strengthening brackets, according to an example.

FIG. 4 is a schematic view of a close-up of a portion of a rail kit 400 including strengthening brackets 104, 108, according to an example. In such examples, and as noted above, once the second strengthening bracket 108 is inserted past a certain point, a clip 404 or prong on the first strengthening bracket 104 may lock both strengthening brackets 104, 108 together, while allowing the rear bracket 106 and second strengthening bracket 108 to move within a certain range. In such examples, the clip 404 or prong may pass over a raised portion 402 or protrusion. The raised portion 402 or protrusion may slope upwards on one edge and have a straight vertical edge on the other. The sloped edge may be the edge where a strengthening bracket is inserted (e.g., the second strengthening bracket 108). When the clip 404 or prong passes over the raised portion 402 or protrusion, the clip 404 or prong may bend upwards and pass over the raised portion 402 or protrusion. Then the clip 404 or prong may flex, bend, or deform back into the clip's 404 or prong's original position. In such examples, the clip 404 or prong may be a flat tab that slopes to a lower flat portion. When the clip 404 or prong has passed over the raise portion 402 or protrusion, the bottom lower flat portion of the clip 404 or prong may prevent the strengthening brackets 104, 108 from separating by abutting against the vertical straight edge of the raised portion. For example, the clip 404 or prong may press against or abut the straight vertical edge of the raised portion 402 or protrusion, the straight vertical edge preventing the clip 404 or prong from passing over raised portion 402 or protrusions).

In another example, the maximum length the rear bracket 106 and second strengthening bracket may be adjusted to could be determined by the clip 404 or prong and the raised portion 402 or protrusion. In other words, the rail kit 400 may support a maximum column depth that may be defined by the maximum configuration noted above.

Figure 5:
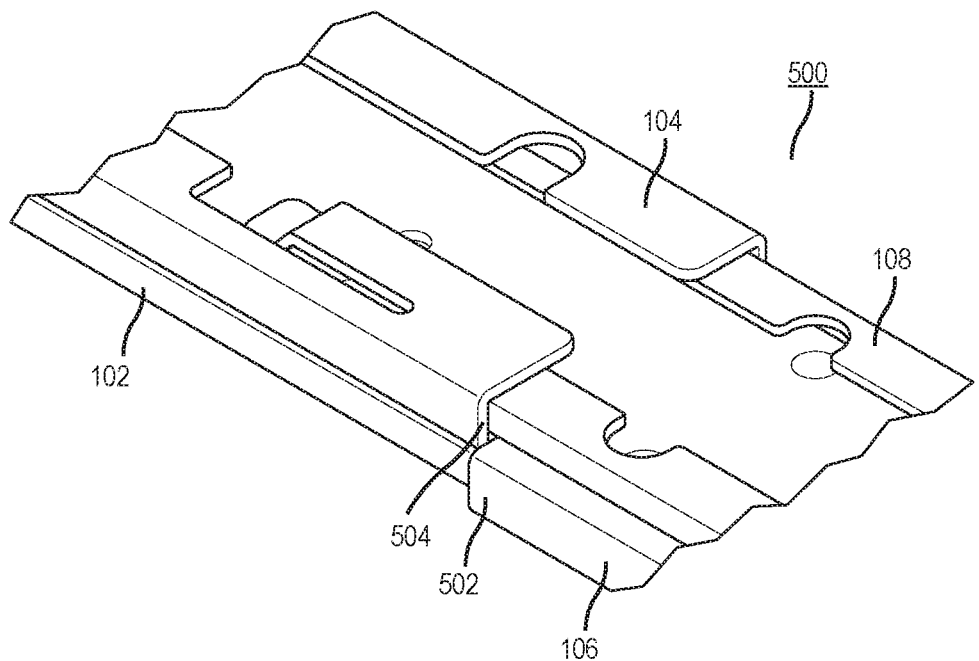
FIG. 5 is another schematic view of a close-up of a portion of a rail kit including strengthening brackets, according to an example.

FIG. 5 is another schematic view of a close-up of a portion of a rail kit 500 including strengthening brackets 104, 108, according to an example. In an example, a rail kit 500 may be configured to support a minimum column depth rack (for example, EIA 19 inch column depth rack). In such examples, the edge 502 of the rear bracket 106 may abut the edge 504 of the first strengthening bracket 104, thus preventing the second strengthening bracket 108 from being inserted further into the first strengthening bracket 104.

FIGS. 6A and 6B are schematic views of a rail kit 600A, 600B including a second strengthening bracket 108, according to an example. In an example, the rear bracket 106 may include the second strengthening bracket 108. The second strengthening bracket 108 may be fixed to the rear bracket 106. In another example, the rear bracket 106, with the attached second strengthening bracket 108, may slide over the outer slide 102. The rear bracket 106, while fitted over the outer slide 102, may not be physically attached to the outer slide 102. Despite the lack of physical attachment, the rail kit 600A, 600B may operate as normal and with the added strength from the strengthening brackets 104, 108.

FIG. 7 is a schematic view of a rear bracket 106 and second strengthening bracket 108, according to an example. As noted above, the second strengthening bracket 108 may attach or couple to the rear bracket 106. In another example, the second strengthening bracket 108 may be fixedly attached to the rear bracket 106. In FIG. 7, the rear bracket 106 and attached second strengthening bracket 108 are shown. In an example, the end 702 of the second strengthening bracket 108 may be inserted into a first strengthening bracket.

FIG. 8 is a schematic view of an outer slide 102 and first strengthening bracket 104, according to an example. As noted above, the first strengthening bracket 104 may attach or couple to the outer slide 102. In another example, the first strengthening bracket 104 may be fixedly attached to the outer slide 102. In FIG. 8, the outer slide 102 and attached first strengthening bracket 104 are shown. In an example, a user may insert the second strengthening bracket into the end 802 of the first strengthening bracket 104.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be examples. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. A rail kit, comprising:
an outer slide;
a first strengthening bracket attached to a back of the outer slide;
a rear bracket to fit over the outer slide; and
a second strengthening bracket attached to a back side of the rear bracket,
wherein the first strengthening bracket includes a tab which slopes to a lower flat portion,
wherein the second strengthening bracket includes a protrusion with an upward-sloping edge and a straight vertical edge, and
wherein the rail kit is configured to be inserted into a rack.

2. The rail kit of claim 1 wherein, the second strengthening bracket is insertable into the first strengthening bracket.

3. The rail kit of claim 1, wherein, the second strengthening bracket is attachable to the first strengthening bracket.

4. The rail kit of claim 1, wherein the first strengthening bracket and second strengthening bracket are adjustable, in relation to a size of the rack.

5. The rail kit of claim 1, wherein, the first strengthening bracket and second strengthening bracket support multiple size racks.

6. The rail kit of claim 1, wherein the rear bracket allows the rail kit to expand or contract to different lengths to allow for insertion of the rail kit into different sized racks, wherein a minimum length is based on when the rear bracket abuts the first strengthening bracket.

7. The rail kit of claim 1, wherein the rear bracket allows the rail kit to expand or contract to different lengths to allow for insertion of the rail kit into different sized racks, wherein a maximum length is based on the straight vertical edge of the protrusion of the second strengthening bracket abutting the tab of the first strengthening bracket.

8. A system, comprising:
a computing device;
a rack; and
a first rail kit as in the rail kit of claim 1, wherein an inner slide of the first rail kit is attached to a first side of the computing device, and a second rail kit as in the rail kit of claim 1, wherein an inner slide of the second rail kit is attached to a second side of the computing device,
wherein the first side of the computing device and the second side of the computing device are parallel;
wherein the computing device is attached to the rack via the first rail kit and the second rail kit.

9. A rail kit, comprising:
an outer slide;
a first strengthening bracket fixedly attached to a back of the outer slide;
a rear bracket to fit over the outer slide; and
a second strengthening bracket fixedly attached to a back side of the rear bracket, wherein the second strengthening bracket and rear bracket engage with the first strengthening bracket and outer slide without tools,
wherein the first strengthening bracket includes a tab which slopes to a lower flat portion,
wherein the second strengthening bracket includes a protrusion with an upward-sloping edge and a straight vertical edge, and
wherein the rail kit is configured to be inserted into a rack.

10. The rail kit of claim 9, wherein, the second strengthening bracket slides into the first strengthening bracket.

11. The rail kit of claim 9, wherein the first strengthening bracket and second strengthening bracket are comprised of metal.

12. The rail kit of claim 9, wherein the rear bracket allows the rail kit to expand or contract to different lengths to allow for insertion of the rail kit into different sized racks, wherein a minimum length is based on when the rear bracket abuts the first strengthening bracket.

13. The rail kit of claim 9, wherein the rear bracket allows the rail kit to expand or contract to different lengths to allow for insertion of the rail kit into different sized racks, wherein a maximum length is based on the straight vertical edge of the protrusion of the second strengthening bracket abutting the tab of the first strengthening bracket.

14. The rail kit of claim 9 wherein the first strengthening bracket is staked to the outer slide and the second strengthening bracket is staked to the rear bracket.

15. The rail kit of claim 9, wherein, the rail kit supports Electronic Industries Association (EIA) 19 inch column depths and 23 inch column depths.

16. The rail kit of claim 9, wherein rear bracket slides along the outer slide.

17. A rail kit, comprising:
an outer slide;
a first strengthening bracket fixedly attached to a back of the outer slide;
a rear bracket to fit over the outer slide; and
a second strengthening bracket fixedly attached to a back side of the rear bracket, wherein the second strengthening bracket engages with the first strengthening bracket and wherein the rear bracket slides along the outer slide,
wherein the first strengthening bracket includes a tab which slopes to a lower flat portion,
wherein the second strengthening bracket includes a protrusion with an upward-sloping edge and a straight vertical edge, and
wherein the rail kit is configured to be inserted into a rack.

18. The rail kit of claim 17, wherein a latch releases the second strengthening bracket from the first strengthening bracket.

19. The rail kit of claim 17, wherein the rail kit attaches to a computing device.

\* \* \* \* \*